United States Patent
Lange

(10) Patent No.: US 7,031,796 B2
(45) Date of Patent: Apr. 18, 2006

(54) RADIATION DAMAGE REDUCTION

(75) Inventor: Steven R. Lange, Alamo, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 273 days.

(21) Appl. No.: 10/654,082

(22) Filed: Sep. 3, 2003

(65) Prior Publication Data

US 2005/0048678 A1    Mar. 3, 2005

(51) Int. Cl.
*G06F 19/00* (2006.01)
*H01L 21/00* (2006.01)

(52) U.S. Cl. .................... 700/123; 700/121; 438/57; 427/492; 427/496

(58) Field of Classification Search ................ 700/123, 700/121; 427/492, 496; 438/57
See application file for complete search history.

(56) References Cited

U.S. PATENT DOCUMENTS

| | | | | |
|---|---|---|---|---|
| 5,107,275 A | * | 4/1992 | Tsuruoka et al. | ............ 347/247 |
| 6,023,068 A | * | 2/2000 | Takahashi | ................ 250/492.2 |
| 6,609,040 B1 | * | 8/2003 | Brunnemann | ................ 700/108 |
| 6,915,172 B1 | * | 7/2005 | Parent et al. | .................. 700/31 |
| 2002/0070469 A1 | * | 6/2002 | Hiatt et al. | ................ 264/40.1 |

* cited by examiner

*Primary Examiner*—Leo Picard
*Assistant Examiner*—Sheela S. Rao
(74) *Attorney, Agent, or Firm*—Luedeka, Neely & Graham, P.C.

(57) ABSTRACT

A method for limiting exposure of a substrate to potentially damaging radiation from a radiating apparatus. A database of information associated with the substrate is compiled, and the substrate is identified prior to processing the substrate on the radiating apparatus. The database of information associated with the substrate is accessed, including its past irradiation history of dosage and type of irradiation, based on the substrate identification, and the operation of the radiating apparatus is selectively modified based at least in part on the information associated with the substrate.

20 Claims, 1 Drawing Sheet

RADIATION DAMAGE REDUCTION

The U.S. Government has a paid-up license in this invention and the right in limited circumstances to require the patent owner to license others on reasonable terms as provided for by the terms of contract number 70NANB0H3038 awarded by NIST.

FIELD

This invention relates to the field of radiation producing equipment. More particularly, this invention relates to instrumentation used in the integrated circuit fabrication industry that emits radiation that is potentially damaging to substrates.

BACKGROUND

Integrated circuit fabrication relies heavily on frequent and consistent inspection of the structures formed at various stages during the fabrication process. Some of the inspections can be electronic or chemical in nature, but a great many of the inspections that are performed are optical in nature. In other words, the substrates or semiconductor substrates on which the integrated circuits are formed are inspected by collecting electromagnetic radiation such as light received from the substrate, whether that light be reflected from or transmitted through the substrate, and inspecting the properties of the collected light.

There is a continual demand to fabricate integrated circuits at ever-decreasing geometries. The shrinking size of the structures and layers of which integrated circuits are comprised has introduced many new issues which need to be addressed. Many of these issues have to do with optical inspection of the integrated circuits and the substrates on which they are formed.

For example, optical substrate inspection systems typically used relatively long illumination wavelengths to image the structures of the integrated circuit. Such long wavelengths were convenient to use, and tended to adequately resolve the larger structures and thicker layers that were used in earlier integrated circuit designs. However, such longer wavelengths tend to be insufficient to resolve the smaller features of integrated circuits formed according to newer design geometries, and also tend to be insufficient to detect smaller defects, which are now of increasing importance.

One solution to this issue is to use relatively shorter illumination wavelengths than those currently used in optical inspections systems. Shorter illumination wavelengths tend to increase the resolution of the optical system, and thus enable a more complete inspection of small structures and defects. However, shorter illumination wavelengths might also tend to damage one or more of the substrate and the other materials used in integrated circuit fabrication. Such radiation damage was not a problem with the longer wavelengths previously used for optical inspection systems. The use of relatively shorter wavelengths of radiation in other technologies, such as alignment systems, also tends to negatively effect certain integrated circuit materials and structures.

What is needed, therefore, is a system by which integrated circuit structures of smaller sizes and of sensitive materials can be adequately inspected or otherwise processed without damaging the delicate materials of which the structures are formed.

SUMMARY

The above and other needs are met by a method for limiting exposure of a substrate to potentially damaging radiation from a radiating apparatus. A database of information associated with the substrate is compiled, and the substrate is identified prior to processing the substrate on the radiating apparatus. The database of information associated with the substrate is accessed, based on the substrate identification, and the operation of the radiating apparatus is selectively modified based at least in part on the information associated with the substrate.

In this manner, structures or materials on the substrate that might be damaged by the radiation produced by the apparatus can be protected by appropriately and selectively modifying the operation of the apparatus. Thus, various aspects of the operation of the apparatus which do not pose a likelihood of damage to a given substrate do not need to be modified, or completely removed from the programming of the apparatus, merely because they are not appropriate for all substrates. Therefore, the apparatus can be run according to a procedure which may be optimized for the unique needs of individual substrates, or batches of substrates, based upon the requirements of the structures and materials on the substrates.

In various preferred embodiments, the step of compiling the database of information comprises manually inputting the information into the radiating apparatus. Alternately the step of compiling the database of information comprises automatically receiving and storing the information from prior processing steps of the substrate and associating the information with the substrate identification. Preferably, the radiating apparatus is an inspection system. The substrate is preferably a semiconducting integrated circuit substrate. The potentially damaging radiation is preferably ultraviolet radiation from at least one of a mercury arc lamp and a laser. Preferably, the step of selectively modifying the operation of the radiating apparatus comprises at least one of reducing a peak power of the radiating apparatus, increasing a scan speed of the radiating apparatus, increasing a shuttering speed of the radiating apparatus, decreasing a shuttering speed of the radiating apparatus, and masking the radiating apparatus at scan reversal points.

According to another aspect of the invention there is described a radiating apparatus for processing a substrate while limiting exposure of the substrate to potentially damaging radiation from the radiating apparatus. A first input receives a substrate identification prior to processing the substrate, and a second input accesses a database of information associated with the substrate, based on the substrate identification. A processor selectively modifies operation of the radiating apparatus based at least in part on the information associated with the substrate.

In various preferred embodiments, the database of information comprises information that is input manually into the radiating apparatus. Alternately, the database of information comprises information from prior processing steps of the substrate that is automatically received, stored, and associated with the substrate identification. Preferably, the radiating apparatus is an inspection system. The substrate is preferably a semiconducting integrated circuit substrate. The potentially damaging radiation is preferably ultraviolet radiation from at least one of a mercury arc lamp and a laser. Preferably, the selective modification of the operation of the radiating apparatus comprises at least one of reducing a peak power of the radiating apparatus, increasing a scan speed of the radiating apparatus, increasing a shuttering speed of the radiating apparatus, decreasing a shuttering speed of the radiating apparatus, and masking the radiating apparatus at scan reversal points.

According to yet another aspect of the invention there is described a software routine stored on a storage device that is readable by a computing device. The software routine controls operation of the computing device, and has modules for receiving a substrate identification and accessing a database of information associated with the substrate based on the substrate identification. Modules also exist for receiving information associated with a radiating apparatus, and presenting information useful to selectively modify operation of the radiating apparatus based at least in part on the information associated with the substrate, so as to limit potential damage to the substrate by the radiating apparatus.

In various preferred embodiments, the database of information is preferably accessed from a remote server that automatically receives and stores the information from prior processing steps of the substrate and associates the information with the substrate identification. Preferably, the radiating apparatus is an inspection system. The substrate is preferably a semiconducting integrated circuit substrate. Preferably, the potential damage to the substrate by the radiating apparatus is ultraviolet radiation from at least one of a mercury arc lamp and a laser. The selective modification of the operation of the radiating apparatus preferably comprises at least one of reducing a peak power of the radiating apparatus, increasing a scan speed of the radiating apparatus, increasing a shuttering speed of the radiating apparatus, decreasing a shuttering speed of the radiating apparatus, and masking the radiating apparatus at scan reversal points.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
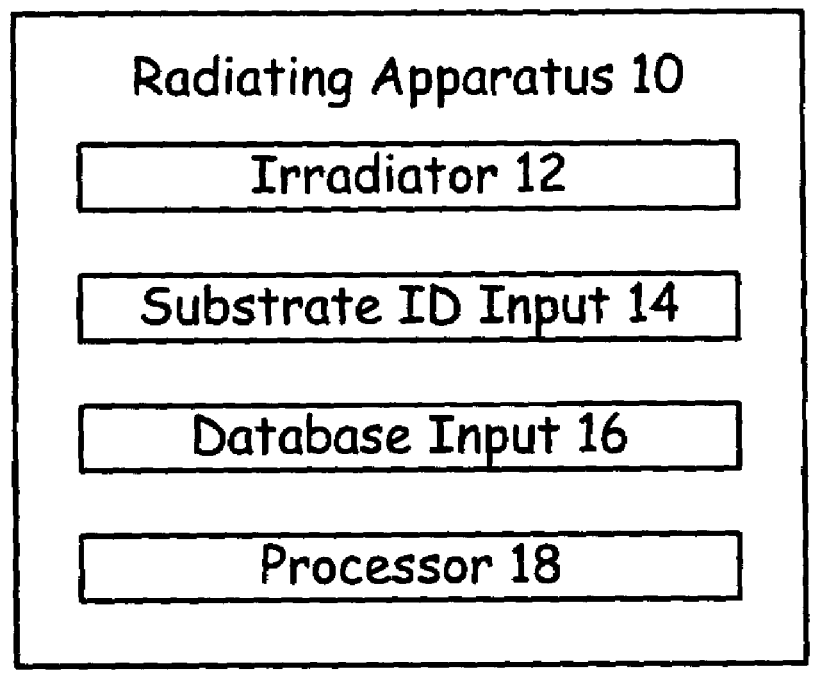
FIG. 1 is a functional block diagram of an apparatus according to a preferred embodiment of the present invention.

With reference now to FIG. 1, there is depicted a functional block diagram of a radiating apparatus 10 according to the present invention. The radiating apparatus 10 includes an irradiator 12, an input 14 to receive a substrate identification, an input 16 to receive information from a database, and a processor 18 which selectively modifies the operation of the apparatus 10. Each of the elements are described in more detail hereafter.

Figure 2:
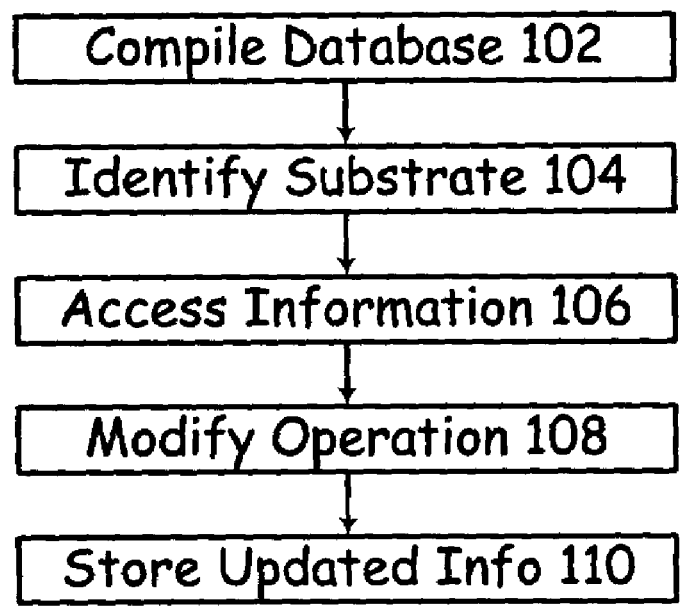
FIG. 2 is a flow chart of a method according to a preferred embodiment of the present invention.

With reference to FIG. 2, there is depicted a flow chart of a method 100 for the operation of the apparatus depicted in FIG. 1. A database of information is compiled on the substrate, as given in block 102. The substrate is identified as given in block 104, and the information associated with the substrate is accessed from the database as given in block 106. The operation of the apparatus 10 is then selectively modified based at least in part on the information associated with the substrate, as given in block 108. These steps are also described in more detail hereafter.

This invention comprehends a method 100, which can be implemented in an apparatus 10 such as for a substrate inspection system, bright-field inspector, dark-field inspector, metrology tool, particle beam inspection, review or metrology tool, or other system which makes use of potentially damaging radiation 12, such as a mercury arc lamp or a deep ultra violet laser designed to be used at short wavelengths. Methods such as acousto-optical deflector scanning of a substrate, and perhaps to an even greater extent scanning by other methods, tend to result in damage to the materials and structures used in integrated circuit fabrication. Such damage can occur at various times during an inspection, such as during alignment, scanning, turn-arounds of the scanner, when using various rotation speeds for rotating substrate tools, and during defect review.

Preferably, data associated with the substrate undergoing inspection is provided to the system directly, or alternately to the equipment operator. The information is preferably associated with the materials and structures at the topmost layer of the substrate, and optionally also associated with one or more materials or structures of the layers underlying the topmost layer, particularly if the topmost layer is transparent at the inspection wavelength.

Most preferably, the data includes not just the material type, but also the thickness of the material, exposure limits for the type of radiation being used, as set by the process engineer or some other authority, and prior history of exposure of such layers to potentially damaging radiation wavelengths, such as from prior inspection or review steps, for example. For example, the accumulated dosage of potentially damaging radiation, such as ultraviolet light, that a substrate receives throughout its total production cycle is preferably logged, such as in a substrate dosage map, and included in the database of information associated with the substrate. Subsequent inspections preferably access the information to determine the conditions under which the substrate had previously been exposed to the potentially damaging radiation. The wavelength of the prior exposures to potentially damaging radiation is also preferably logged. The current inspection is then preferably modified based at least in part upon the information in the database, so as to not exceed the damage threshold of any previously irradiated materials, such as underlying materials that have transparent materials over them.

The information provided for the substrate can be entered manually, such as by the operator, or can be entered automatically into the system from a centralized database, such as under the control of an apparatus control program or recipe. Entry of the information can be accomplished by tracking the substrate such as with a bar code or other identifier. Information about the recipe to be used by the radiating equipment, such as the wavelength and intensity of the radiation to be used, could also be entered, either manually or automatically.

As a part of the procedure, the operator is preferably warned about possible damage to the substrate, if such damage is potentially a risk, and given a menu of possible ways to mitigate the damage. In addition, the equipment could be interlocked such that potentially damaging operation of the equipment cannot be accomplished on the substrate. The operator preferably selects the desired option from the damage mitigation techniques displayed during the process. Alternately, the recipe automatically selects possible mitigating processes based on the comparison of the substrate information and radiation history and tolerance with the radiation exposure data for the instrument. Different mitigating processes can be selected either manually or automatically depending in part upon criteria such as the past processing history of the substrate, or the future anticipated processing of the substrate. The goals of the selection of the mitigating process are preferably to limit at least one of an exposure peak and an exposure accumulation of radiation to various structures that might be damaged thereby, depending upon the unique requirements of the substrate materials and structures.

A number of different techniques can be employed to minimize the potential damage to the substrate, depending upon the nature of the damage mechanism identified during the routine. For example, the damage mechanism may be that the intended peak power of the instrument is too great for the materials or structures on the substrate. Alternately, the damage mechanism may be that the intended radiation dosage is too great from the materials or structures on the substrate.

Any suitable method for controlling the exposure of the substrate during alignment, inspection, and review could be used, such as filters, polarizers, brag cells, shutters, and field stops. For example, with substrate rotation systems, one or both of the illumination source power and the rotation speed of the substrate can be limited to maintain a dosage under the damage threshold. A fast shutter can be employed during stage turnaround to avoid exposing the substrate when the stage is not moving at fast inspection speeds. During a fast scan by an acousto-optical deflector, galvometer, or harmonic oscillator, an intermediate field stop or aperture can be utilized to prevent the light from striking the substrate during the scan turnaround times at the edge of the frame, where the irradiation beam tends to move more slowly, thereby increasing the dosage at those locations.

Depending upon the nature of the damage mechanism, the use of slow and fast shutters can be employed to limit the exposure of the substrate to the radiation. During a scanning operation of the substrate, the dosage is typically low enough so that no damage is observed. However, during alignment and particularly review operations, dosages can be high enough to damage the materials, as described above. With deep ultra violet wavelengths, a total exposure of about one second is typically long enough to damage many materials. A slow shutter of about one-thirtieth of a second on the radiation source is typically sufficient illumination to capture a video image with a review camera. Using the slow shutter linked with typical review actions, such as moving the substrate around the defect site under review, focus changes, illumination changes, and noting the total exposure, tends to limit the total accumulated exposure and inform the user on the total dosage accumulated.

Further, certain portions of the alignment and review processes can be switched to longer wavelengths to minimize the damage to the substrate, materials, and structures. The use of somewhat longer wavelengths of radiation allows for longer exposures before the damage threshold is passed. A fast shutter can be employed during stage turnaround. The exposure limit could be varied with the type of substrate, the inspection recipe, and other variables. More than one of the methods described above could be combined for even greater control over these problems.

Once the modified process has been accomplished on the substrate, the database of information associated with the substrate is preferably updated with the new processing information as given in step 110, which most preferably includes updating information in regard to the irradiation of the substrate, including information such as the wavelength, dosage, and peak exposure of the irradiation as a function of the location on the sample.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for limiting exposure of a substrate to potentially damaging radiation from a radiating apparatus, the method comprising the steps of:

compiling a database of information associated with the substrate, where the information is in regard to a susceptibility of the substrate to the potentially damaging radiation as determined from conditions of the substrate prior to processing on the radiating apparatus, identifying the substrate prior to processing the substrate on the radiating apparatus, accessing the database of information associated with the substrate, based on the substrate identification, and selectively modifying operation of the radiating apparatus in regard to the potentially damaging radiation delivered to the substrate based at least in part on the information associated with the substrate so as to not damage the substrate with the potentially damaging radiation.

2. The method of claim 1, wherein the step of compiling the database of information comprises manually inputting the information into the radiating apparatus.

3. The method of claim 1, wherein the step of compiling the database of information comprises automatically receiving and storing the information from prior processing steps of the substrate and associating the information with the substrate identification.

4. The method of claim 1, wherein the radiating apparatus is an inspection system.

5. The method of claim 1, wherein the substrate is a semiconducting integrated circuit substrate.

6. The method of claim 1, wherein the potentially damaging radiation is ultraviolet radiation from at least one of a mercury arc lamp and a laser.

7. The method of claim 1, wherein the step of selectively modifying the operation of the radiating apparatus comprises at least one of reducing a peak power of the radiating apparatus, increasing a scan speed of the radiating apparatus, increasing a shuttering speed of the radiating apparatus, decreasing a shuttering speed of the radiating apparatus, filtering the potentially damaging radiation, polarizing the potentially damaging radiation, and masking the radiating apparatus at scan reversal points.

8. A radiating apparatus for processing a substrate while limiting exposure of the substrate to potentially damaging radiation from the radiating apparatus, the radiating apparatus comprising:

a first input adapted to receive a substrate identification prior to processing the substrate, a second input adapted to access a database of information associated with the substrate, based on the substrate identification, where the information is in regard to a susceptibility of the substrate to the potentially damaging radiation as determined from conditions of the substrate prior to processing on the radiating apparatus, and a processor adapted to selectively modify operation of the radiating apparatus based at least in part on the information associated with the substrate.

9. The apparatus of claim 8, wherein the database of information comprises information that is input manually into the radiating apparatus.

10. The apparatus of claim 8, wherein the database of information comprises information from prior processing steps of the substrate that is automatically received, stored, and associated with the substrate identification.

11. The apparatus of claim 8, wherein the radiating apparatus is an inspection system.

12. The apparatus of claim 8, wherein the substrate is a semiconducting integrated circuit substrate.

13. The apparatus of claim 8, wherein the potentially damaging radiation is ultraviolet radiation from at least one of a mercury arc lamp and a laser.

14. The apparatus of claim 8, wherein the selective modification of the operation of the radiating apparatus comprises at least one of reducing a peak power of the radiating apparatus, increasing a scan speed of the radiating apparatus, increasing a shuttering speed of the radiating apparatus, decreasing a shuttering speed of the radiating apparatus, filtering the potentially damaging radiation, polarizing the potentially damaging radiation, and masking the radiating apparatus at scan reversal points.

15. A software routine stored on a storage device that is readable by a computing device, the software routine adapted to control operation of the computing device, the software routine having modules for:

receiving a substrate identification, accessing a database of information associated with the substrate, based on the substrate identification, where the information is determined from conditions of the substrate prior to processing with a radiating apparatus, receiving information associated with the radiating apparatus, and presenting information useffil to selectively modify operation of the radiating apparatus based at least in part on the information associated with the substrate, so as to limit potential damage to the substrate by the radiating apparatus.

16. The software routine of claim 15, wherein the database of information is accessed from a remote server that automatically receives and stores the information from prior processing steps of the substrate and associates the information with the substrate identification.

17. The software routine of claim 15, wherein the radiating apparatus is an inspection system.

18. The software routine of claim 15, wherein the substrate is a semiconducting integrated circuit substrate.

19. The software routine of claim 15, wherein the potential damage to the substrate by the radiating apparatus is ultraviolet radiation from at least one of a mercury arc lamp and a laser.

20. The software routine of claim 15, wherein the selective modification of the operation of the radiating apparatus comprises at least one of reducing a peak power of the radiating apparatus, increasing a scan speed of the radiating apparatus, increasing a shuttering speed of the radiating apparatus, decreasing a shuttering speed of the radiating apparatus, filtering potentially damaging radiation, polarizing the potentially damaging radiation, and masking the potentially damaging radiation at scan reversal points.

* * * * *